(12) United States Patent
Chen et al.

(10) Patent No.: US 7,852,156 B1
(45) Date of Patent: Dec. 14, 2010

(54) CLASS-D POWER AMPLIFIER HAVING DISTORTION-SUPPRESSING FUNCTION

(75) Inventors: Ming-Hsiung Chen, Taipei (TW); Shang-Shu Chung, Taipei (TW); Tung-Sheng Ku, Taipei (TW)

(73) Assignee: Amazing Microelectronic Corp., Zhonghe, Taipei County (TW)

( * ) Notice: Subject to any disclaimer, the term of this patent is extended or adjusted under 35 U.S.C. 154(b) by 0 days.

(21) Appl. No.: 12/545,077

(22) Filed: Aug. 21, 2009

(51) Int. Cl.
*H03F 3/217* (2006.01)

(52) U.S. Cl. .................. 330/251; 330/10; 330/149; 330/207 A

(58) Field of Classification Search .............. 330/251, 330/10, 149, 207 A
See application file for complete search history.

(56) References Cited

U.S. PATENT DOCUMENTS

| | | | |
|---|---|---|---|
| 6,853,242 B2 * | 2/2005 | Melanson et al. | 330/10 |
| 7,142,050 B2 * | 11/2006 | Risbo | 330/10 |
| 7,279,967 B2 * | 10/2007 | Quilter | 330/10 |
| 7,348,840 B2 * | 3/2008 | Magrath et al. | 330/10 |
| 7,456,686 B2 * | 11/2008 | Nadd | 330/10 |
| 7,474,149 B2 * | 1/2009 | Snelgrove et al. | 330/136 |
| 7,554,390 B1 * | 6/2009 | Shankar et al. | 330/10 |

\* cited by examiner

*Primary Examiner*—Patricia Nguyen
(74) *Attorney, Agent, or Firm*—Roger H. Chu

(57) ABSTRACT

A Class-D power amplifier having a distortion-suppressing function includes a gain control unit, a first PWM unit, a second PWM unit, a current control unit, and a level control unit. The level control unit includes at least one D flip-flop and at least one XNOR gate. The D flip-flop has an output end coupled with the gain control unit and an R end coupled with an output end of the XNOR gate. When the Class-D power amplifier has its positive output end and negative output end respectively and simultaneously outputting a high-level signal and a low-level signal to the XNOR gate, the XNOR gate outputs the high-level signal to the D flip-flop. Then the D flip-flop outputs the high-level signal to the gain control unit as feedback for controlling the gain control unit to reduce audio gain, thereby suppressing audio distortion.

7 Claims, 7 Drawing Sheets

CLASS-D POWER AMPLIFIER HAVING DISTORTION-SUPPRESSING FUNCTION

BACKGROUND OF THE INVENTION

1. Technical Field

The present invention relates to power amplifiers and, more particularly, to a Class-D power amplifier having the function of distortion suppression.

2. Description of Related Art

Power amplifiers are essential for driving loudspeakers. Common power amplifiers include Class-AB power amplifiers and Class-D power amplifiers. Therein, a Class-D power amplifier is superior to a Class-AB one in efficiency by two to five folds. Besides, Class-D power amplifiers have significantly lower energy demand and power consumption than Class-AB power amplifiers.

It is known that a Class-D power amplifier implements the PWM (Pulse Width Modulation) technology to covert input audio signals into switch signals, which turn on or off power electronic devices so as to amplify the audio signals. However, the amplified audio signals output by the Class-D power amplifier also contain modulated high-frequency harmonics so that a low-pass filter has to be provided at the output end at the rear stage of the Class-D power amplifier to filter out such high-frequency harmonic components. Then, after waveform restoration, the audio signals are delivered to a loudspeaker for playing. Nevertheless, the low-pass filter is typically realized by an LC filter, which increases the volume and circuit costs of the resultant Class-D power amplifier.

Therefore, research and development of filterless Class-D power amplifiers have been carried out. Please refer to FIG. 1, which is a circuit diagram of a conventional filterless Class-D power amplifier. The depicted filterless Class-D power amplifier 500 includes an input amplifier 502, an error amplification unit 503, a first reference wave generator 504, a second reference wave generator 505, a first comparator 506, a second comparator 507, a gate drive circuit 508, an output stage FET (Field Effect Transistor) unit 509, and a feedback unit 513.

An audio signal 501 is input to the negative input end of the input amplifier 502 through an input capacitor CIN5. The input amplifier 502 pre-amplifies the audio signal 501 and inputs a pre-amplified audio signal to the error amplification unit 503, i.e., the negative input end of an integrator 5031, through an integrator resistor R51. Therein, the integrator 5031 is coupled with the integrator resistor R51 and an integrator capacitor C51. The pre-amplified audio signal is amplified and sent by the error amplification unit 503 to the positive input ends of the first and second comparators 506, 507. The negative input ends of the first and second comparators 506, 507 are respectively coupled with the first and second reference wave generators 504, 505, which generate a first reference wave and a second reference wave, respectively. By comparing the audio signal with the reference wave, each of the first and second comparators 506, 507 outputs a PWM signal to the gate drive circuit 508 so that the gate drive circuit 508 is driven to turn on or off the output stage FET unit 509, which is typically composed of power transistors. Consequently, the audio signals are output from the positive output end OUTP and the negative output end OUTN of the filterless Class-D power amplifier 500 to a loudspeaker 512. Meantime, a feedback amplifier 5131 and feedback resistors RFB1, RFB2, RFB3 are used for feedback control of the audio gain.

The aforementioned filterless Class-D power amplifier, though effective in outputting audio signals to loudspeakers and responding to input audio signals by means of the feedback unit, has its defects and shortcomings.

Firstly, the feedback unit is incapable of clamping the audio gain. While the feedback unit positively responds to the input audio signal, it fails to prevent audio distortion caused by excessive audio gain. FIG. 2 provides output waveforms of the conventional filterless Class-D power amplifier. In the waveform diagram, the double-headed arrows indicate intervals where the positive output end OUTP outputs a high-level signal while the negative output end OUTN outputs a low-level signal, or intervals where the negative output end OUTN outputs a high-level signal while the positive output end OUTP outputs a low-level signal. Since the audio signal received by the loudspeaker is the difference between the signals output from the positive and negative output ends, when the difference results from subtracting a relatively low-level audio signal from a relatively high-level audio signal, the resultant audio signal that is received by the loudspeaker tends to be distorted due to excessive gain.

On the other hand, the two-stage audio signal amplification process carried out by the input amplifier and the error amplification unit is very complicated and may lead to gate delay when signals are output from the front stage to the rear stage, thus incurring audio distortion.

With the ambition to remedy the defects of the conventional filterless Class-D power amplifiers, the inventor of the present invention has given every effort to research and innovation, and finally develops a novel Class-D power amplifier having a distortion-suppressing function.

SUMMARY OF THE INVENTION

A primary objective of the present invention is to provide a Class-D power amplifier having a distortion-suppressing function, wherein the power amplifier uses basic logic gates to monitor output audio signals and prevent audio distortion, thereby ensuring the quality of output from a loudspeaker using such power amplifier.

A secondary objective of the present invention is to provide a Class-D power amplifier having a distortion-suppressing function, wherein the power amplifier incorporates a differential amplifier and variable resistors so as to effectively amplify audio signals while preventing audio distortion caused by gate delay.

According to the present invention, a Class-D power amplifier having a distortion-suppressing function includes: a gain control unit, a first PWM unit, a second PWM unit, a current control unit, and a level control unit. The level control unit includes at least one D flip-flop and at least one XNOR gate. The D flip-flop has an output end coupled with the gain control unit and an R end coupled with an output end of the XNOR gate. Thus, when the Class-D power amplifier has its positive output end Out and negative output end Outb respectively outputting a high-level signal and a low-level signal to the XNOR gate at the same time, the XNOR gate outputs the high-level signal to the D flip-flop. Consequently, the D flip-flop outputs the high-level signal to the gain control unit as feedback so as to make the gain control unit reduce audio gain, thereby suppressing audio distortion.

BRIEF DESCRIPTION OF THE DRAWINGS

The invention as well as a preferred mode of use, further objectives, and advantages thereof will be best understood by reference to the following detailed description of an illustrative embodiment when read in conjunction with the accompanying drawings, wherein.

DETAILED DESCRIPTION OF THE PREFERRED EMBODIMENT

Figure 1:
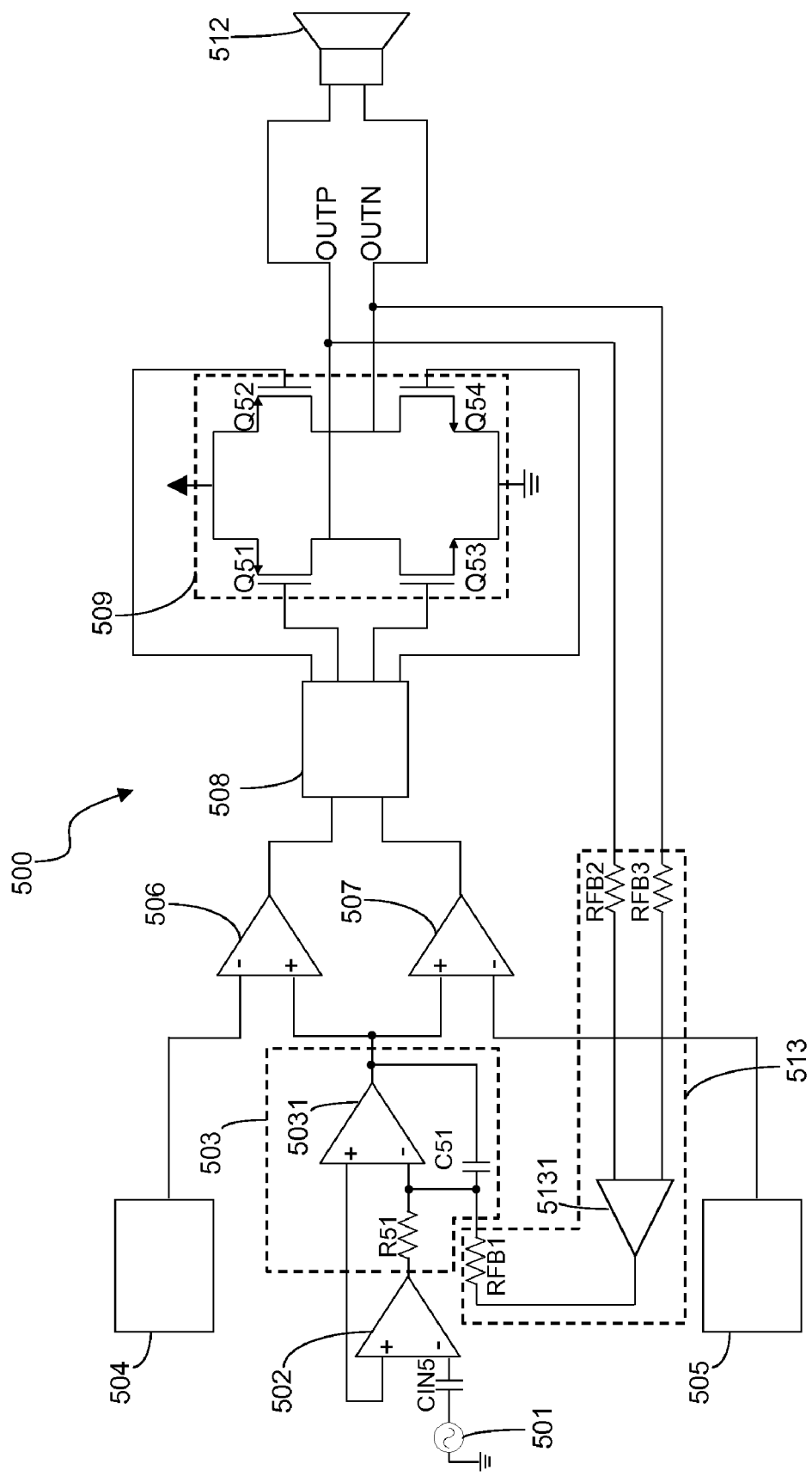
FIG. 1 is a circuit diagram of a conventional filterless Class-D power amplifier.
Figure 2:
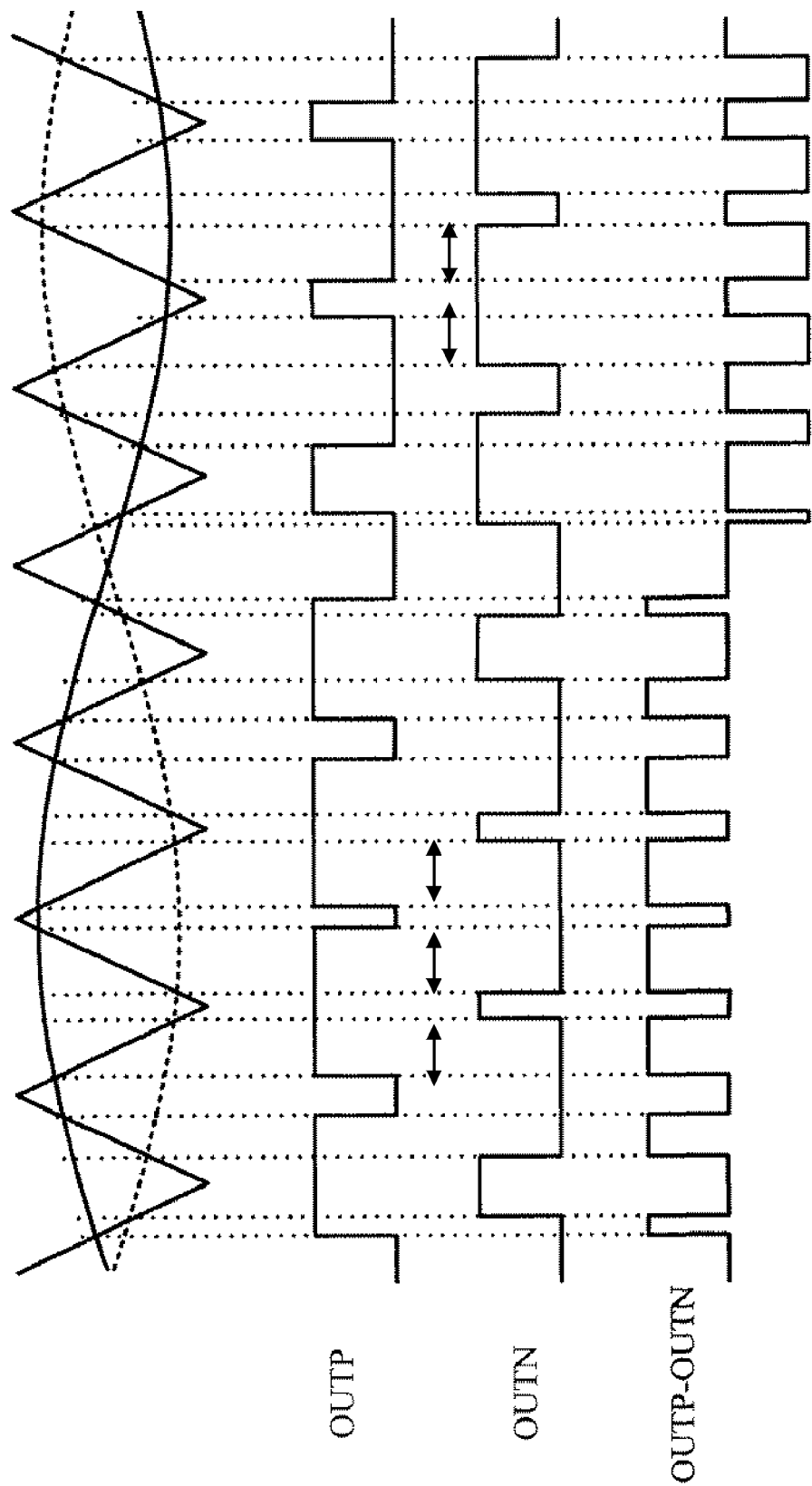
FIG. 2 is an output waveform diagram of the conventional filterless Class-D power amplifier.
Figure 3:
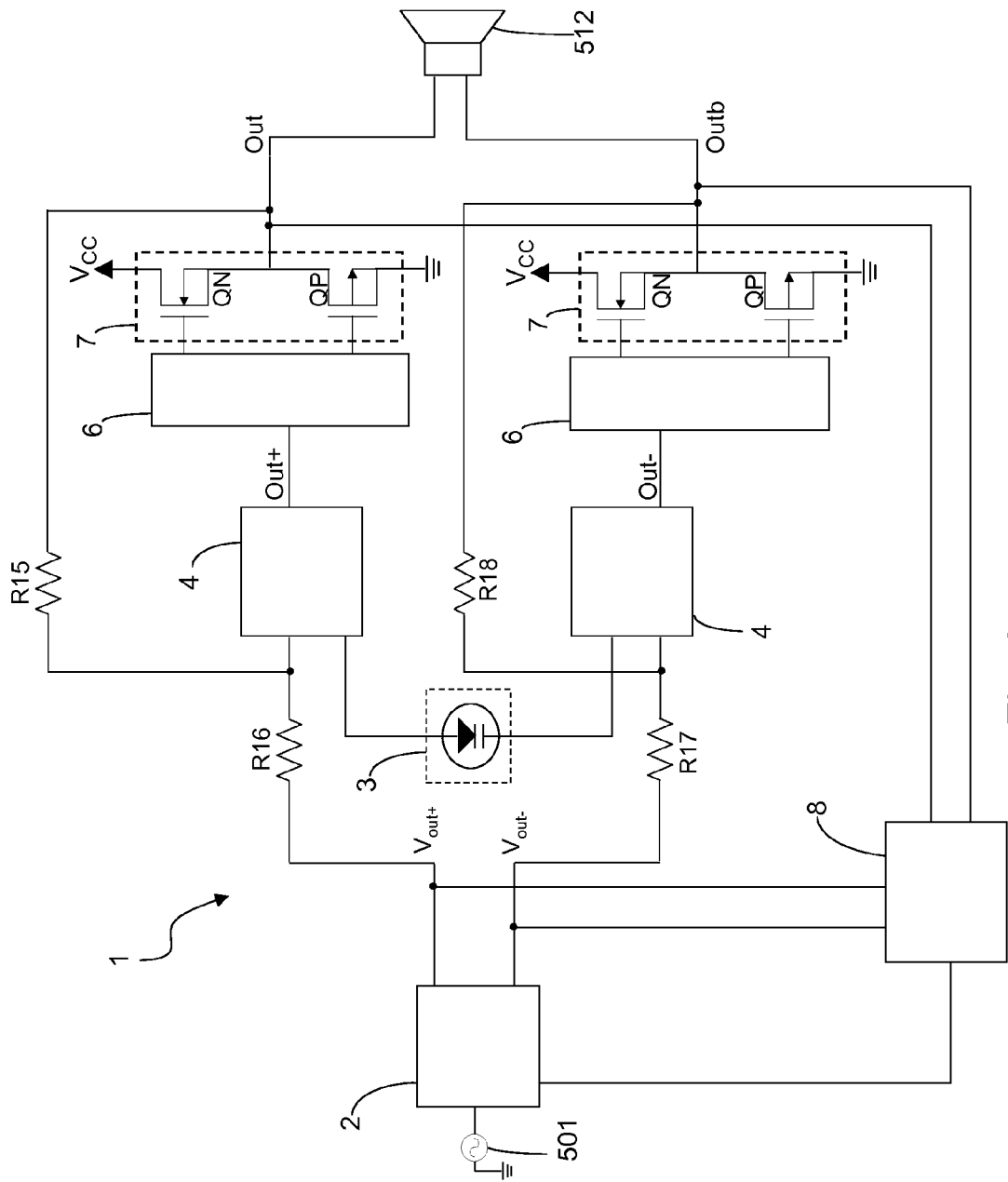
FIG. 3 is a circuit diagram of a Class-D power amplifier having a distortion-suppressing function according to the present invention.
Figure 4:
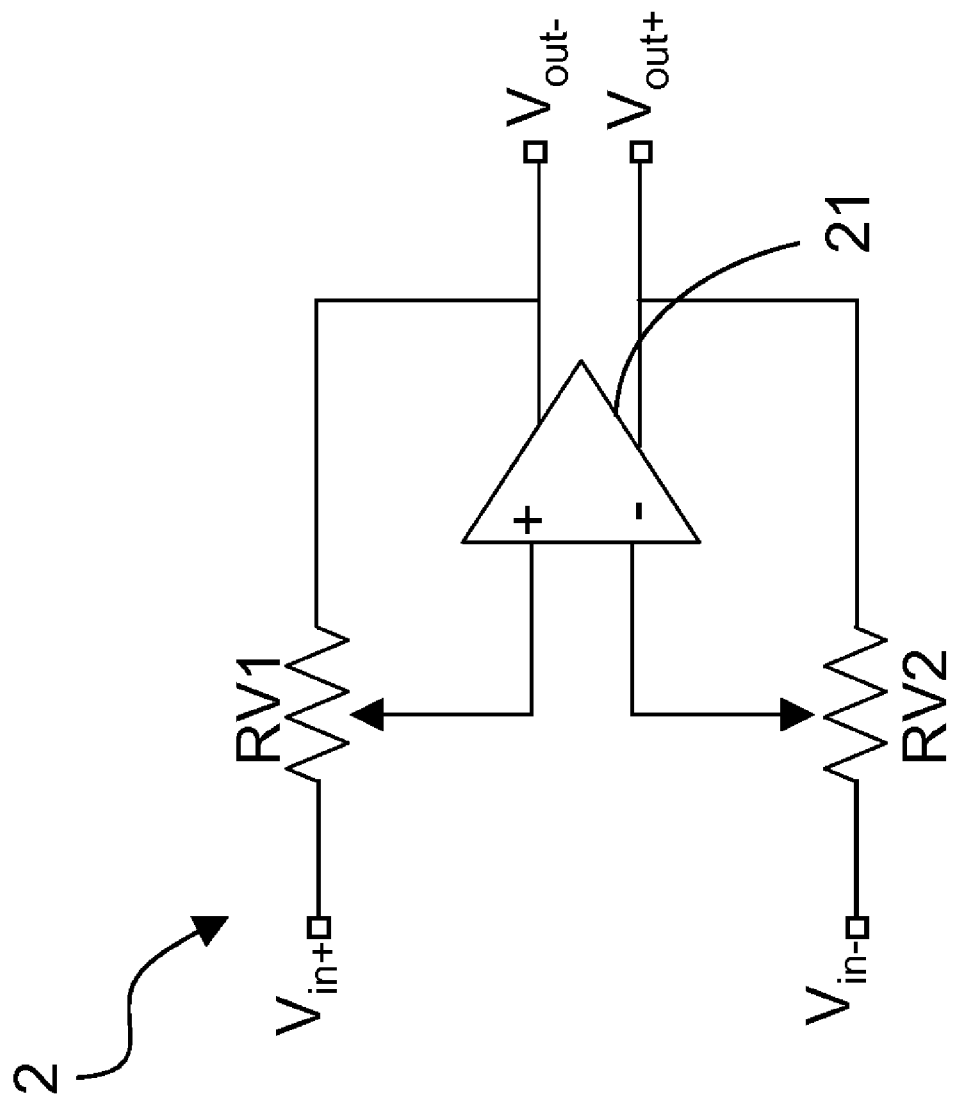
FIG. 4 is a circuit diagram of a fully differential OPA in the Class-D power amplifier of the present invention.

Please refer to FIGS. 3 and 4 for a Class-D power amplifier having a distortion-suppressing function according to the present invention and a fully differential OPA of the Class-D power amplifier. The Class-D power amplifier 1 has a positive output end Out and a negative output end Outb for driving a loudspeaker 512. The Class-D power amplifier 1 includes a gain control unit 2, two PWM units 4, two FET drive units 6, two output stage FET units 7, and a level control unit 8.

The gain control unit 2 includes a fully differential OPA 21 that has a positive input end $V_{in+}$, a negative input end $V_{in-}$, a positive output end $V_{out+}$, and a negative output end $V_{out-}$. The positive input end $V_{in+}$ and the negative input end $V_{in-}$ of the fully differential OPA 21 are coupled with an audio signal 501. After the audio signal 501 is amplified, the positive output end $V_{out+}$ and the negative output end $V_{out-}$ output amplified audio signals to the two PWM units 4 at the next stage by way of resistors R16 and R17. A first variable resistor RV1 is coupled between the positive input end $V_{in+}$ and the negative output end $V_{out-}$ of the fully differential OPA 21 so that gain of the amplified audio signal from the negative output end $V_{out-}$ of the fully differential OPA 21 can be modulated by adjusting the resistance of the first variable resistor RV1. Besides, a second variable resistor RV2 is coupled between the negative input end $V_{in-}$ and the positive output end $V_{out+}$ of the fully differential OPA 21 so that gain of the amplified audio signal from the positive output end $V_{out+}$ of the fully differential OPA 21 can be modulated by adjusting the resistance of the second variable resistor RV2.

Figure 5:
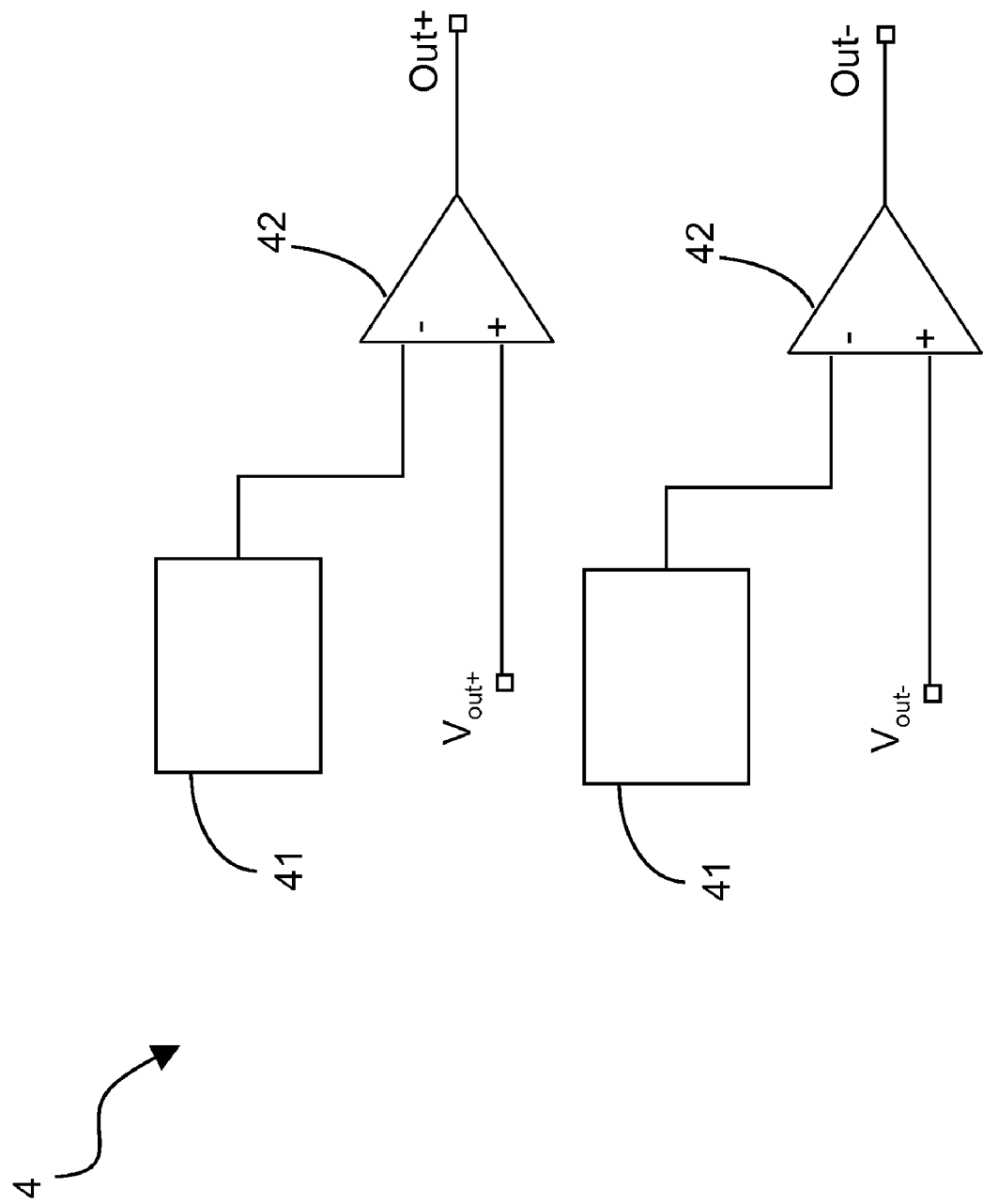
FIG. 5 is a circuit diagram of a PWM unit in the Class-D power amplifier of the present invention.

Referring to FIG. 5 for a circuit diagram of the PWM units 4 in the disclosed Class-D power amplifier 1. Each of the PWM units 4 includes a reference wave generator 41 and a comparator 42. The comparator 42 has a positive input end, a negative input end, and an output end, wherein the negative input end is coupled with the reference wave generator 41 for receiving a reference wave signal therefrom. In the present embodiment, two PWM units 4 are used which are coupled with the negative output end $V_{out-}$ and the positive output end $V_{out+}$ of the fully differential OPA 21, respectively. Therefore, the positive input end of the comparator 42 in one of the PWM units 4 is coupled with the negative output end $V_{out-}$ of the fully differential OPA 21 through the resistor R16 while the positive input end of the comparator 42 in the other PWM unit 4 is coupled with the positive output end $V_{out+}$ of the fully differential OPA 21 through the resistor R17 so that the comparators 42 receive the amplified audio signals from the positive and negative output ends of the fully differential OPA 21, respectively. In addition, the reference wave signals generated by the two reference wave generators 41 are in opposite phases so as to facilitate comparison by the comparators 42 between the reference wave signals and the amplified audio signals output by the positive and negative output ends of the fully differential OPA 21. For each comparator 42, if the amplified audio signal is at a higher level than that of the corresponding reference wave signal, the comparator 42 outputs a high-level PWM signal; otherwise, the comparator 42 outputs a low-level PWM signal.

The two FET drive units 6 are coupled with the two PWM units 4, respectively.

Each of the two output stage FET units 7 includes an N-type power FET QN that is coupled with $V_{CC}$ and a P-type power FET QP that is grounded, wherein both power FETs QN and QP are coupled with a corresponding one of the FET drive units 6. The FET drive units 6 receive the PWM signals output by the PWM units 4 so as to turn on or off the corresponding output stage FET units 7 accordingly, thereby driving the loudspeaker 512.

Figure 6A:
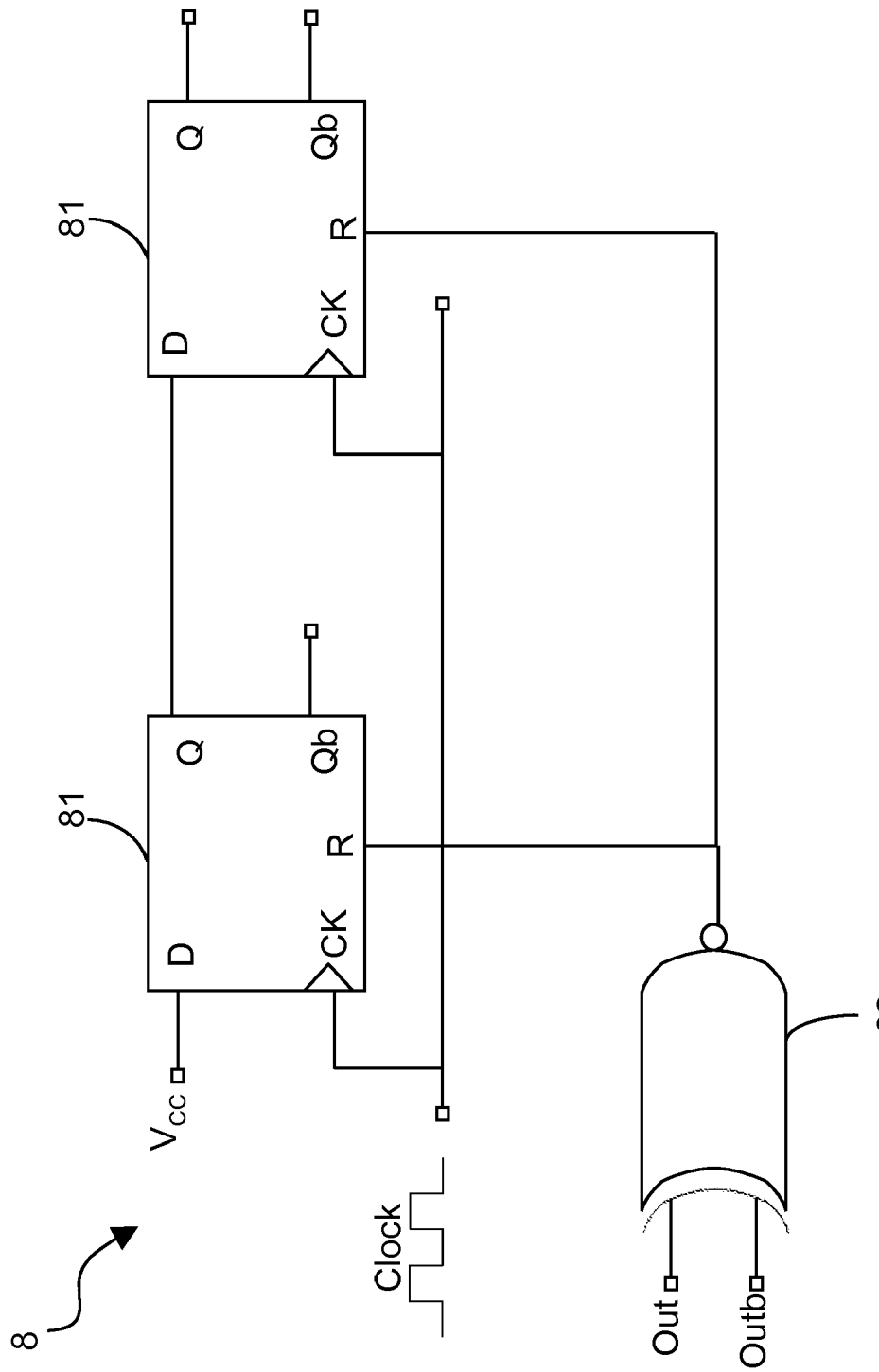
FIGS. 6A and 6B are circuit diagrams of a level control unit in the Class-D power amplifier of the present invention.
Figure 6B:
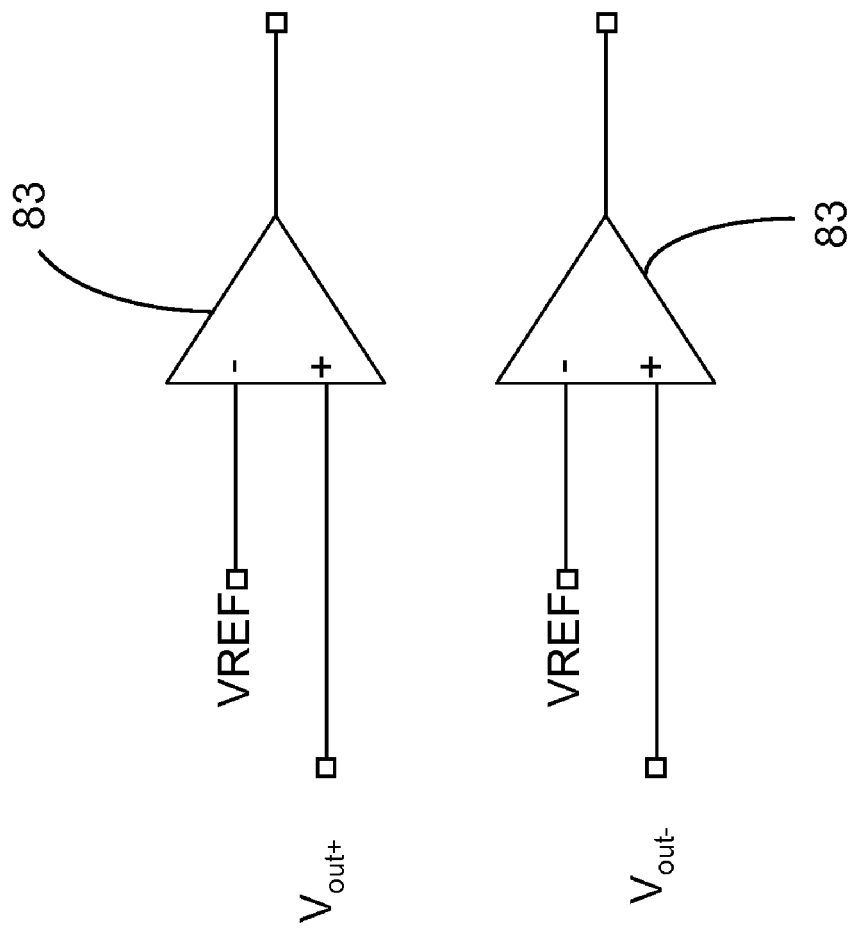

The level control unit 8 includes at least one D flip-flop 81 that has a D end, a CK end, a Q end, a Qb end and an R end Reset. Therein, the D end and the CK end are input ends while the Q end and the Qb end are output ends. The D flip-flop 81 has the D end coupled with a high-level DC (direct current) signal of $V_{CC}$, the CK end coupled with a clock signal Clock, and the Q end coupled with the gain control unit 2, while leaving the Qb end floating. The level control unit 8 also includes at least one XNOR gate 82 that has two input ends and one output end. The two input ends of the XNOR gate 82 are coupled with the positive output end Out and the negative output end Outb of the Class-D power amplifier 1, respectively. Furthermore, the output end of the XNOR gate 82 is coupled with the R end Reset of the D flip-flop 81. Please see FIG. 6A for a circuit diagram of the level control unit 8 of the Class-D power amplifier 1 according to the present embodiment, wherein the level control unit 8 has two D flip-flops 81 connected in series. When the CK ends of the D flip-flops 81 receive a system clock signal having a period of 3 μs, and the Class-D power amplifier 1 outputs to the loudspeaker 512 a high-level audio signal High and a low-level audio signal Low from the positive output end Out and the negative output end Outb, respectively, the audio signal received by the loudspeaker 512 will be distorted if the high-level and low-level audio signals are continuously output for more than 6 μs. At this time, the XNOR gate 82, after receiving the high-level and low-level audio signals from the positive output end Out and the negative output end Outb of the Class-D power amplifier 1, immediately passes, by virtue of the nature of an XNOR gate, the high-level signal to the R ends of the D flip-flops 81. Since the D end of the first D flip-flop 81 is coupled with the DC high-level signal of $V_{CC}$, the first D flip-flop 81 outputs, by virtue of the nature of a D flip-flop, the high-level signal to the second D flip-flop 81. The second D flip-flop 81 then outputs the high-level signal as feedback to the gain control unit 2, thereby directing the gain control unit 2 to reduce audio gain so that audio distortion is suppressed. Referring to FIG. 6B, which is a partial circuit diagram of the level control unit 8 of the Class-D power amplifier 1 according to the present invention, the level control unit 8 further includes two comparators 83 each having two input ends and one output end. The positive input ends of the two comparators 83 are coupled with the positive and negative output ends $V_{out+}$, $V_{out-}$ of the fully differential OPA 21, respectively. The negative input ends of the two comparators 83 are coupled with a reference voltage VREF. In addition, the output ends of the comparators 83 are coupled with the first variable resistor RV1 and the second variable resistor RV2, respectively. The comparators 83 serve to preliminarily identify distortion of the amplified audio signals output by the positive output end $V_{out+}$ and the negative output end $V_{out-}$ of the fully differential OPA 21, and then provide the identification result as feedback to the first variable resistor RV1 and the second variable resistor RV2 for audio gain adjustment.

Moreover, according to the present embodiment, the Class-D power amplifier 1 also includes a current control unit 3 that is coupled with the two PWM units 4. The current control unit 3 serves to generate a constant current signal, which constant current signal and the amplified audio signal jointly form a current modulation signal. By adjusting the current modulation signal, power consumption of the Class-D power amplifier 1 can be reduced.

The Class-D power amplifier 1 further includes some additional resistors. Resistors R15 and R18, which function as output feedback resistors, are coupled between the PWM units 4 and the positive and the negative output ends Out, Outb of the Class-D power amplifier 1. Resistors R16 and R17, which serve as input buffer resistors, are coupled between the PWM units 4 and the gain control unit 2.

To sum up, by arranging the D flip-flop and the XNOR gate between the output ends and the gain control unit, the present invention enables the monitoring of signals at the output ends so as to suppress audio distortion through feedback.

The Class-D power amplifier of the present invention is more advantageous than the prior art for the following reasons.

Firstly, the disclosed Class-D power amplifier uses the D flip-flop in conjunction with the XNOR gate to timely detect distortion of audio signal output by the power amplifier. Upon detecting any such distortion, the power amplifier immediately adjusts audio gain through feedback.

Secondly, the disclosed Class-D power amplifier uses the integrated fully differential OPA to achieve pre-amplification of audio signals while the gain of audio amplification is adjusted by modulating the resistances of the variable resistors. In contrast to the conventional power amplifier that uses two-stage audio amplification, the present invention uses only one integrated fully differential OPA and thus eliminates gate delay which might otherwise happen during input and output between front and rear stages.

The present invention has been described by reference to the preferred embodiment, and it is understood that the embodiment is not intended to limit the scope of the present invention. Moreover, as the contents disclosed herein should be readily understood and can be implemented by a person skilled in the art, all equivalent changes or modifications which do not depart from the concept of the present invention should be encompassed by the appended claims.

What is claimed is:

1. A Class-D power amplifier having a distortion-suppressing function, wherein the Class-D power amplifier has a positive output end (Out) and a negative output end (Outb) for driving a loudspeaker, the Class-D power amplifier comprising:
  a gain control unit coupled with an audio signal;
  at least one PWM unit coupled with the gain control unit so as to receive an amplified audio signal output by the gain control unit and generate a PWM signal;
  at least one FET drive unit coupled with the PWM unit;
  at least one output stage FET unit coupled with the at least one FET drive unit, wherein the at least one FET drive unit receives the PWM signal output by the at least one PWM unit and turns on or off the at least one output stage FET unit according to the PWM signal, thereby driving the loudspeaker; and
  a level control unit comprising:
    at least one D flip-flop having two input ends, two output ends, and one R end (Reset), wherein the two input ends of each said D flip-flop are coupled with a high-level direct current signal of $V_{cc}$ and a clock signal (Clock), respectively, while the two output ends of each said D flip-flop are coupled with the gain control unit and left floating, respectively; and
    at least one XNOR gate having two input ends and one output end, wherein the two input ends of each said XNOR gate are coupled with the positive output end (Out) and the negative output end (Outb) of the Class-D power amplifier, respectively, while the output end of each said XNOR gate is coupled with the R end (Reset) of each said D flip-flop, wherein when the positive output end (Out) and the negative output end (Outb) of the Class-D power amplifier respectively and simultaneously output a high-level signal (High) and a low-level signal (Low) to the two input ends of each said XNOR gate, each said XNOR gate outputs the high-level signal to the at least one D flip-flop, and the at least one D flip-flop outputs the high-level signal to the gain control unit as feedback so as to control the gain control unit to reduce audio gain, thereby suppressing audio distortion.

2. The Class-D power amplifier of claim 1, further comprising:
  a current control unit coupled with the at least one PWM unit and configured for generating a constant current signal, wherein the constant current signal and the amplified audio signal jointly form a current modulation signal; and
  a plurality of resistors, wherein some of the resistors are coupled between the positive output end (Out) and the negative output end (Outb) of the Class-D power amplifier and the at least one PWM unit and serve as output feedback resistors, while the other of the resistors are coupled between the at least one PWM unit and the gain control unit and serve as input buffer resistors.

3. The Class-D power amplifier of claim 1, wherein the gain control unit comprises:
  a fully differential OPA having a positive input end ($V_{in+}$), a negative input end ($V_{in-}$), a positive output end ($V_{out+}$), and a negative output end ($V_{out-}$), wherein the positive input end ($V_{in+}$) and the negative input end ($V_{in-}$) are coupled with the audio signal, and, after the audio signal is amplified, the positive output end ($V_{out+}$) and the negative output end ($V_{out-}$) output the amplified audio signal to the at least one PWM unit at a next stage;
  a first variable resistor coupled between the positive input end ($V_{in+}$) and the negative output end ($V_{out-}$) of the fully differential OPA so that, by adjusting the resistance of the first variable resistor, gain of the amplified audio signal output by the negative output end ($V_{out-}$) of the fully differential OPA is modulated; and
  a second variable resistor coupled between the negative input end ($V_{in-}$) and the positive output end ($V_{out+}$) of the fully differential OPA so that, by adjusting the resistance of the second variable resistor, gain of the amplified audio signal output by the positive output end ($V_{out+}$) of the fully differential OPA is modulated.

4. The Class-D power amplifier of claim 1, wherein each said PWM unit comprises:
  a reference wave generator; and
  a comparator having a positive input end, a negative input end, and an output end, wherein the negative input end of the comparator is coupled with the reference wave generator for receiving a reference wave signal from the reference wave generator, and the positive input end of the comparator is coupled with the gain control unit for receiving the amplified audio signal so that if the level of the amplified audio signal is higher than the level of the reference wave signal, the comparator outputs the high-level signal; otherwise, the comparator outputs the low-level signal.

5. The Class-D power amplifier of claim 1, wherein each said output stage FET unit comprises an N-type power FET that is coupled with the $V_{CC}$ and a P-type power FET that is grounded.

6. The Class-D power amplifier of claim 1, wherein the level control unit further comprises at least one comparator having two input ends and one output end, the two input ends being coupled with the gain control unit and a reference voltage, respectively, and the output end being coupled with the gain control unit so as to provide feedback to the gain control unit.

7. The Class-D power amplifier of claim 1, wherein each said D flip-flop has the input end coupled with the high-level direct current signal of the $V_{cc}$ defined as a D end, the input end coupled with the clock signal (Clock) defined as a CK end, the output end coupled with the gain control unit defined as a Q end, and the output end left floating defined as a Qb end.

* * * * *